United States Patent [19]

Zajac

[11] 4,392,915
[45] Jul. 12, 1983

[54] WAFER SUPPORT SYSTEM

[75] Inventor: John Zajac, San Jose, Calif.

[73] Assignee: Eaton Corporation, Cleveland, Ohio

[21] Appl. No.: 348,625

[22] Filed: Feb. 16, 1982

[51] Int. Cl.³ .............. H01L 21/306; B44C 1/22; C03C 15/00; C03C 25/06
[52] U.S. Cl. .............. 156/643; 156/646; 156/345; 204/298; 269/21
[58] Field of Search .............. 156/345, 643, 646; 250/531; 204/192 E, 164, 298; 269/21

[56] References Cited

U.S. PATENT DOCUMENTS

| | | | |
|---|---|---|---|
| 3,645,581 | 2/1972 | Lasch et al. | 302/2 R |
| 4,160,690 | 7/1979 | Shibagaki et al. | 156/643 |
| 4,341,592 | 7/1982 | Shortes et al. | 156/643 |

OTHER PUBLICATIONS

Microelectronic Manufacturing and Testing, 1981 (Jan.), Automated Wafer Handling and Processing, Corey Mullins, pp. 40–41.

*Primary Examiner*—William A. Powell
*Attorney, Agent, or Firm*—C. H. Grace; F. M. Sajovec

[57] ABSTRACT

A system for supporting wafers (18) on a gas cushion within the vacuum chamber (12) of a plasma etcher (10). An etchant gas is introduced into the vacuum chamber, and a second gas at a volume flow rate much lower than the volume flow rate of the etchant gas is directed to orifices formed in a wafer-receiving surface of an electrode (16) to define the gas cushion. In accordance with one aspect of the invention, the second gas is an inert gas, and in accordance with another aspect of the invention, the second gas is a reactant gas which is also directed into the vacuum chamber to serve as a reactant gas in conjunction with the first reactant gas.

13 Claims, 1 Drawing Figure

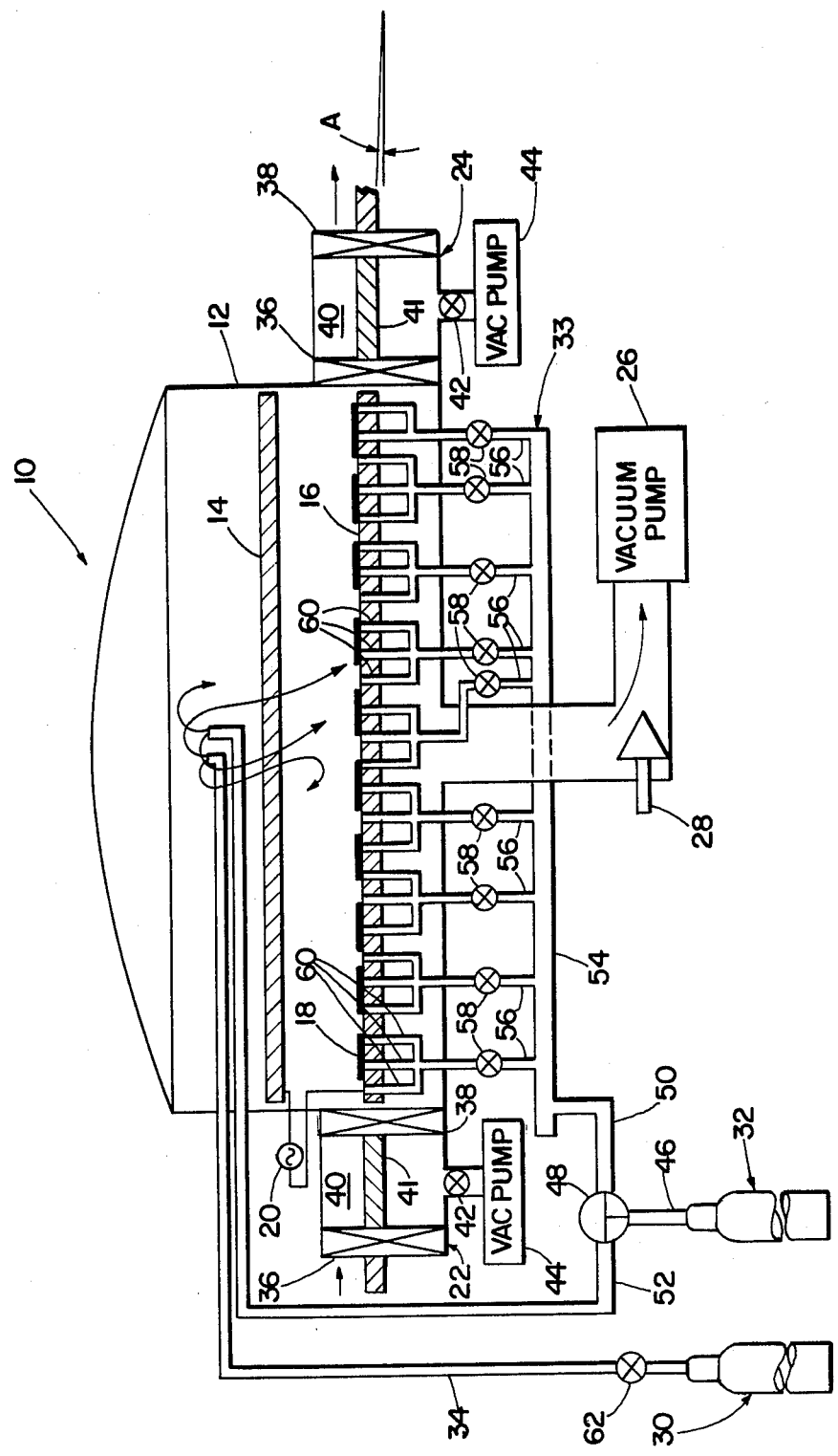

WAFER SUPPORT SYSTEM

The present invention relates generally to gas bearing support systems for semiconductor wafers, and more particularly to a gas bearing support system for wafers within an evacuated chamber.

Gas bearing support systems are well known, as shown by U.S. Pat. No. 3,645,581 to Lasch, and have been widely used in mask aligners, and other wafer processing systems which operate at atmospheric pressure. Heretofore, however, gas bearing support and transport systems have not been used in plasma etching systems because such systems operate within a vacuum chamber, the prevailing thought being that gas under pressure and volume conditions sufficient to support wafers cannot be introduced into the vacuum chamber of a plasma etching apparatus without adversely affecting the etching process.

The present invention is based on the discovery that in certain applications, wafers within a plasma etching apparatus can be supported on a gas cushion or gas bearing without adversely affecting the etching process. More specifically, when operating in a vacuum there is essentially no atmospheric pressure acting on both sides of a wafer to contend with. Thus in a typical etching process operating at 200u pressure there is on the order of only 1/5000 of an atmosphere acting on the wafer, and the pressure of a support gas flowing beneath the wafer is not reduced due to Bernoulli effects as it would be in an atmospheric system. As a result, wafers in a vacuum system can be supported with gas at a flow rate of about 1 cubic centimeter per minute which is not sufficient gas flow to cause a significant pressure differential in a system which is being continually pumped down. Accordingly, in many applications the support gas can be a separate, inert gas; however; in some cases, for example when large wafers are being processed, a portion of the reactant gas can be diverted to serve as the support gas.

In accordance with another aspect of the invention, the wafers are transported along a predetermined path within the etching apparatus while they are supported on a gas cushion by disposing the path at an angle to the horizontal so that the wafers are moved from one end of the path to the other by gravity.

Other objectives and advantages of the invention will be apparent from the following description when taken in connection with the accompanying drawing, which is a cross-sectional view of a plasma etching apparatus incorporating the invention.

Referring to the drawing, there is illustrated a plasma etching apparatus 10 comprising a vacuum chamber 12, an upper electrode 14, a lower electrode 16 on which wafers 18 are received, an R.F. power supply 20 connected to the electrodes, an entry vacuum lock 22, an exit vacuum lock 24, a main vacuum pump 26, a main vacuum valve 28, an etching gas supply designated generally by the numeral 30, a support gas supply designated generally by the numeral 32, and a gas support system connected to the gas supply 32 and designated generally by the numeral 33.

Plasma etching apparatus per se is well known and will not be described in detail herein. In a typical etching process, wafers 18 are positioned on the lower electrode 16, and the chamber 12 is evacuated by means of the main vacuum pump 26. The chamber is then backfilled with the appropriate reactant gas such as a fluorocarbon gas by means of gas supply 30 and a supply line 34, and R.F. energy is applied to the electrodes 14 and 16 by the power supply 20. The electrical discharge causes a breakdown in the gas molecules resulting in chemically reactive species such as atoms, free radicals, ions and electrons which react with a thin film on the wafers to form a volatile product that is pumped away by the vacuum pump. It should be noted that a single gas source 30 is shown for illustration only; in actual practice the reactant gas can be a combination of several gases from a plurality of separate sources.

The vacuum locks 22 and 24 permit wafers to be loaded into the vacuum chamber and removed thereform while the chamber remains evacuated. The locks, which are depicted schematically in the FIGURE, each comprise an input valve 36, an output valve 38, an evacuable chamber 40 between the valves, a wafer receiving platform 41 within the chamber, a vacuum valve 42, and means to evacuate the chamber 40. The latter means is shown as a vacuum pump 44 connected to each chamber for illustrative purposes; however, it is apparent that the chambers 40 could connected to evacuating means common to both chambers. Wafers can be loaded onto and removed from the receiving platforms 41 by any convenient means including air track, belt conveyor or walking beam, the present invention being directed only to the handling of wafers within the vacuum chamber 12.

The gas support system 33 comprises a supply conduit 46 connected to the supply 32; a valve 48; a first branch conduit 50 connected to one outlet port of the valve; a second branch conduit 52 connected to a second outlet port of the valve; a manifold 54 connected to the first branch conduit; a plurality of supply lines 56 extending from the manifold and into the vacuum chamber 12, each supply line having a valve 58 therein; and a plurality of gas conduits 60 branching off from the lines 56, extending through the lower electrode 16 and ending in a plurality of orifices in the surface of the electrode 16, over which the wafers 18 are received.

As will be described in more detail later, the support gas can be an inert gas such as nitrogen or argon or it can be one or more of the reactant gases. If reactant gas is used, the second branch conduit 52, which extends into the vacuum chamber 12, can be used to supply reactant gas to the chamber in conjunction with the supply 30.

In accordance with the invention, gas flowing through the lines 60 supports the wafers 18 on a gas cushion in a known manner. To guide the wafers 18 along the electrode 16, a ledge or lip (not shown) is provided along at least one side of the electrode. In order to move the wafers through the chamber the lower electrode 16, or the entire apparatus as shown herein, is disposed at an angle A to the horizontal so that the wafers are moved by gravity from left to right. Since the gas cushion defines a nearly frictionless surface, the angle A need only be on the order of 1° for effective transport of the wafers.

OPERATION

In a majority of etching applications, 3, 4 or 5 inch wafers are processed in a vacuum of 100–300u within the chamber 12, and with a reactant gas flow of 50 to 500 cc/min. It has been found that wafers can be supported on a cushion of an inert gas flowing at a rate of only 1 cc/miniute. Under the above vacuum and gas flow conditions a support gas flow of only 1 cc/min will cause a pressure rise within the vacuum chamber of only 1 to 5u, which is essentially unnoticeable in a vacuum of 100–300u. When, as described above, an inert gas can be used as the support gas, the valve 48 is set so that gas from the supply 32 is directed only to the manifold 54 via branch conduit 50, and the second branch conduit 52 may not be used.

If the etching process requires a pressure lower than 100u within the chamber 12, a reactant gas or gasses can be used as the support gas. Under these conditions, the valve 48 is set to the position shown so that the reactant gas flows from the supply 32 to both the manifold 54 and the second branch conduit 52. Reactant gas thus flows into the chamber 12 via lines 34 and 52 as well as through the support gas lines 60. To insure that the total reactant gas flow into the chamber is correct for the particular process being performed a valve 62 in the line 34 can be used to meter the flow from supply 30. Since only reactant gas is now entering the chamber 12 there will be no additional pressure rise due to the use of a gas support system within the vacuum chamber.

In a typical etching cycle wafers 18 pass through entry vacuum lock 22 and into the vacuum chamber 12. Under normal operating conditions the valves 58 are individually opened and closed in sequence so that the wafers alternately rest on the electrode 16 and are supported above the electrode surface by the gas cushion provided by the gas support system 33. During each sequence in which the wafers are supported on the gas cushion they will move from left to right as viewed in the drawing FIGURE by virtue of the angled disposition of electrode 16, such that the wafers move stepwise through the vacuum chamber over a predetermined time span. When the wafers reach the exit end of the vacuum chamber they pass through the exit vacuum lock 24 for further processing.

I claim:

1. In a plasma etching apparatus comprising a vacuum chamber, a first electrode received within said vacuum chamber, a second electrode received within said vacuum chamber in spaced relation to said first electrode, a wafer-receiving surface formed on said second electrode, a first supply of a first gas, and means for conducting said first gas from said first supply into said vacuum chamber; the improvement comprising a plurality of orifices formed in said wafer-receiving surface, a second supply of a second gas, and means conducting said second gas from said second supply to said orifices to define gas bearing means supporting said wafers above said second electrode.

2. Apparatus as claimed in claim 1, in which said first gas is a reactant gas capable of forming a plasma within said vacuum chamber when radio frequency electrical energy is applied to said first and second electrodes.

3. Apparatus as claimed in claims 1 or 2, in with said second gas comprises an inert gas.

4. Apparatus as claimed in claim 1 in which said first and second gas each comprises a reactant gas capable of forming a plasma within said vacuum chamber when radio frequency electrical engery is applied to said first and second electrodes.

5. Apparatus as claimed in claim 1, in which said means conducting said second gas comprises a manifold, conduit means connecting said second supply of said second gas to said manifold, and conduit means connecting said manifold to said orifices.

6. Apparatus as claimed in claim 5, including valve means in the conduit means connecting said manifold to said orifices, each of said valve means controlling the flow of gas to one or more of said orifices.

7. Apparatus as claimed in claim 1, in which said means conducting said second gas from said second supply to said orifices comprises first conduit means; and including valve means in said first conduit means, and second conduit means having one end connected to said valve means and the other end extending into said vacuum chamber, said valve means being operable to selectively direct the flow of gas from said second supply to said first and second conduit means, or to said first conduit means only.

8. Apparatus as claimed in claim 7, in which said first and said second gas each comprises a reactant gas capable of forming a plasma within said vacuum chamber when radio frequency electrical energy is applied to said first and second electrodes.

9. A method of operating a plasma etcher comprising positioning one or more wafers on an electrode within the vacuum chamber of said plasma etcher, directing a flow of a first gas into said vacuum chamber above said one or more wafers at a first predetermined volume flow, and selectively directing a second gas into said vacuum chamber through said electrode toward the one or more wafers positioned thereon at a second predetermined volume flow to alternately support said one or more wafers on a cushion of said second gas and then allow said one or more wafers to come to rest in engagement with said electrode.

10. A method as claimed in claim 9, in which said first gas is a reactant gas capable of forming a plasma within said vacuum chamber.

11. A method as claimed in claim 9, in which said second gas is an inert gas.

12. A method as claimed in claim 9, including directing said second gas to said vacuum chamber above said wafers as well as beneath said wafers, said first and second gases both being reactant gases capable of forming a plasma within said vacuum chamber.

13. A method of operating a plasma etcher comprising moving wafers one by one into an entrance end of the vacuum chamber thereof and onto a surface of an electrode of said plasma etcher, said surface being inclined slightly downward from the horizontal toward the exit end of the chamber; directing a flow of a first gas into said vacuum chamber above said electrode at a first predetermined volume flow; and selectively directing a second gas into said vacuum chamber through said electrode and toward the wafers thereon to alternately support said wafers on a cushion of said second gas and then to allow said one or more wafers to come to rest in engagement with said electrode, said wafers being moved by gravity toward said exit end when said wafers are supported by the second gas.

* * * * *